United States Patent
Dahlen et al.

(10) Patent No.: US 9,310,066 B2
(45) Date of Patent: Apr. 12, 2016

(54) ELECTRONIC COMPONENT FOR AN IMPROVED LIGHTING SYSTEM

(71) Applicant: KENALL MANUFACTURING COMPANY, Gurnee, IL (US)

(72) Inventors: Kevin Dahlen, Lindenhurst, IL (US); Steven Akiyama, New Lenox, IL (US)

(73) Assignee: KENALL MANUFACTURING COMPANY, Kenosha, WI (US)

( * ) Notice: Subject to any disclaimer, the term of this patent is extended or adjusted under 35 U.S.C. 154(b) by 136 days.

(21) Appl. No.: 14/100,464

(22) Filed: Dec. 9, 2013

(65) Prior Publication Data

US 2015/0159852 A1  Jun. 11, 2015

(51) Int. Cl.
| | |
|---|---|
| *F21V 29/503* | (2015.01) |
| *H05K 7/20* | (2006.01) |
| *F21K 99/00* | (2010.01) |
| *F21V 29/87* | (2015.01) |
| *F21Y 101/02* | (2006.01) |

(52) U.S. Cl.
CPC .............. *F21V 29/503* (2015.01); *F21K 9/30* (2013.01); *F21V 29/87* (2015.01); *H05K 7/20436* (2013.01); *F21Y 2101/02* (2013.01)

(58) Field of Classification Search
CPC ..... F21V 29/004; F21V 29/503; F21V 29/87; F21K 9/30; H05K 7/20436; F21Y 2101/02
See application file for complete search history.

(56) References Cited

U.S. PATENT DOCUMENTS

| | | |
|---|---|---|
| 5,301,090 A | 4/1994 | Hed |
| 5,738,436 A | 4/1998 | Cummings et al. |
| 5,787,576 A | 8/1998 | Warren et al. |
| 6,197,444 B1 | 3/2001 | Vackar |
| 6,375,338 B1 | 4/2002 | Cummings et al. |
| 2004/0082209 A1 | 4/2004 | Zenaboni |
| 2004/0105264 A1 | 6/2004 | Spero |
| 2007/0076459 A1 | 4/2007 | Limpkin |
| 2009/0073692 A1 | 3/2009 | Berger et al. |
| 2009/0290343 A1 | 11/2009 | Brown et al. |
| 2010/0085748 A1 | 4/2010 | Kelly et al. |
| 2010/0110684 A1 | 5/2010 | Abdelsamed et al. |
| 2010/0142202 A1 | 6/2010 | Sugishita et al. |
| 2010/0280677 A1 | 11/2010 | Budike, Jr. |
| 2011/0164411 A1 | 7/2011 | Sparing et al. |
| 2011/0273877 A1 | 11/2011 | Reed et al. |

(Continued)

FOREIGN PATENT DOCUMENTS

EP    2317206 A1    5/2011

OTHER PUBLICATIONS

International Search Report and Written Opinion for corresponding International Application No. PCT/US2014/046603, dated Oct. 2, 2014.

*Primary Examiner* — Mary Ellen Bowman
(74) *Attorney, Agent, or Firm* — Marshall, Gerstein & Borun LLP

(57) ABSTRACT

An electronic component includes a housing, a heat-generating component, a heat sink, and a sealing element. The housing is made of a first metallic material. The heat-generating component is disposed in the housing. The heat sink, which is made of a second metallic material, is disposed adjacent the heat-generating component and configured to dissipate heat from the heat-generating component. The sealing element is disposed between the housing and the heat sink and insulates the second metallic material from the first metallic material.

26 Claims, 13 Drawing Sheets

(56) References Cited

U.S. PATENT DOCUMENTS

| | | |
|---|---|---|
| 2012/0159821 A1 | 6/2012 | Miletich et al. |
| 2012/0176795 A1 | 7/2012 | Lynch |
| 2012/0217882 A1 | 8/2012 | Wong et al. |
| 2012/0249016 A1 | 10/2012 | Smith |
| 2012/0293086 A1 | 11/2012 | Ishikita et al. |
| 2012/0294000 A1 | 11/2012 | Thomas et al. |
| 2013/0003373 A1 | 1/2013 | Hamby et al. |
| 2013/0027935 A1 | 1/2013 | Ladewig et al. |
| 2013/0058108 A1* | 3/2013 | Blincoe et al. ............... 362/373 |
| 2013/0062724 A1 | 3/2013 | Tokuyama et al. |
| 2013/0063935 A1 | 3/2013 | Thrailkill |
| 2013/0077311 A1 | 3/2013 | Kinnune et al. |
| 2013/0208471 A1 | 8/2013 | Lueken et al. |

* cited by examiner

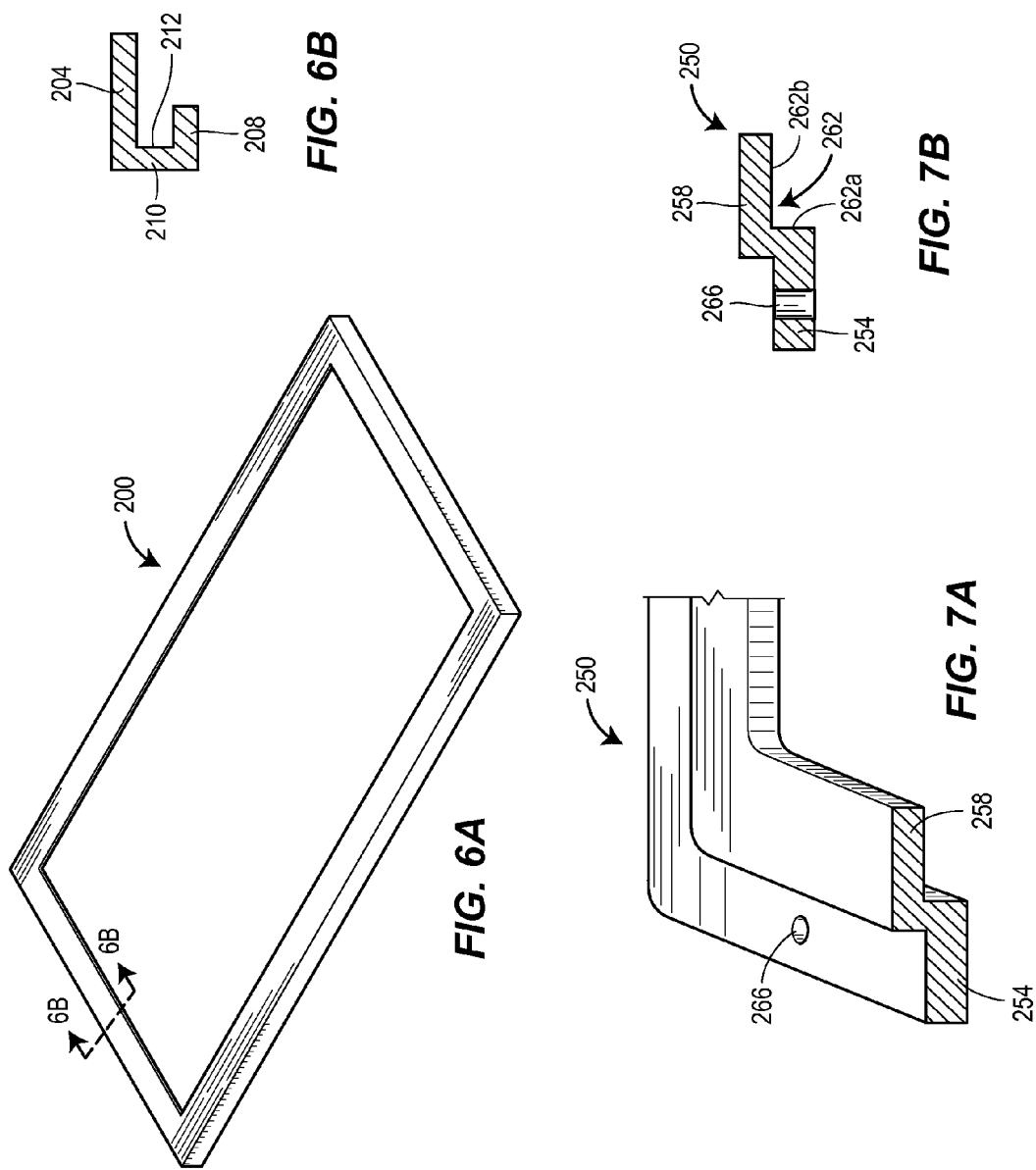

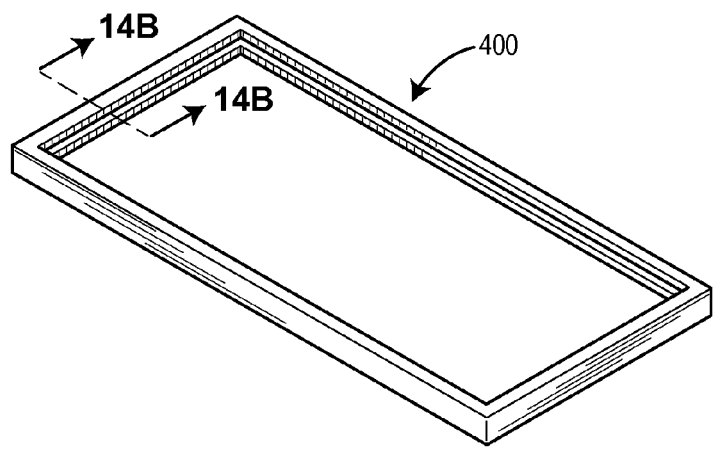
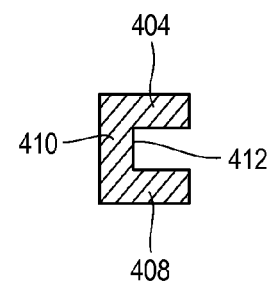
FIG. 14A
FIG. 14B
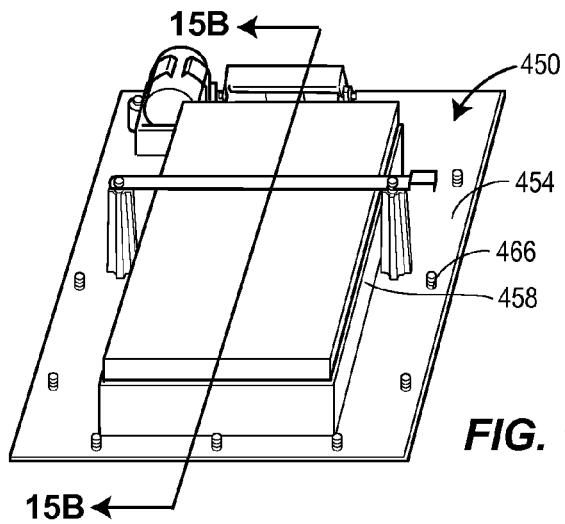
FIG. 15A
FIG. 15B

ELECTRONIC COMPONENT FOR AN IMPROVED LIGHTING SYSTEM

FIELD

This application generally relates to electronic components for lighting systems, and, more particularly, to an electronic component for a lighting system that includes a housing, a heat sink, and a sealing element configured to seal the heat sink and insulate the heat sink from the housing.

BACKGROUND

Many commercial buildings, parking structures, transportation areas or structures (e.g., tunnels), and the like are equipped with lighting systems that typically include several luminaires or light fixtures configured to illuminate certain areas. Some luminaires with LEDs for example can be powered by drivers that are physically wired to the luminaires. The luminaires and the drivers are typically stored in metallic housings (e.g., aluminum housings). In operation, the luminaires and/or the drivers generate significant amounts of heat, which can build up in these metallic housings, and, in turn, affect the performance of these components.

These lighting systems can thus employ heat sinks to help dissipate some of this heat. In these cases, the heat sinks are mechanically or thermally instead of electrically connected to the housings, such that the heat sinks provide a pathway for dissipating the heat directly or radiantly to the surrounding environment. These heat sinks are, however, typically made of the same metallic material as the housings. When, however, these heat sinks are made of a different metallic material than the housings, the direct electrical contact between the housings and the heat sinks can lead to or produce a galvanic reaction, which, as known in the art, is an electrochemical process by which one metal corrodes.

SUMMARY

One aspect of the present disclosure provides an electronic component that includes a housing, a heat-generating component, a heat sink, and a sealing element. The housing is made of a first metallic material. The heat-generating component is disposed in the housing. The heat sink, which is made of a second metallic material, is disposed adjacent the heat-generating component and configured to dissipate heat from the heat-generating component. The sealing element is disposed between the housing and the heat sink. The sealing element insulates the second metallic material from the first metallic material.

Another aspect of the present disclosure provides an electronic component that includes a housing, a heat-generating component, a heat sink, and a sealing element. The housing has a first pair of opposing sidewalls, a second pair of opposing sidewalls, a bottom wall, and a cavity defined by the bottom wall. The heat-generating component disposed within the cavity. The heat sink disposed adjacent the heat-generating component and configured to dissipate heat from the heat-generating component. The sealing element is disposed within the cavity between the housing and the heat sink. The sealing element insulates the heat sink from the housing.

One aspect of the present disclosure provides an electronic component that includes a housing, a heat-generating component, a sealing element, and a heat sink. The heat-generating component is disposed in the housing. The sealing element is coupled to a portion of the housing and defines a receiving channel. The heat sink has a portion disposed in the receiving channel of the sealing element. The heat sink is configured to dissipate heat from the heat-generating component. The sealing element insulates the heat sink from the housing.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

FIG. 6A is a perspective view of an exemplary sealing element employed in the electronic component of FIG. 1.

FIG. 6B is a cross-sectional view, taken along line 6-6 in FIG. 6A, of the exemplary sealing element of FIG. 6A.

FIG. 7A is a perspective view of a portion of an exemplary retainer employed in the electronic component of FIG. 1.

FIG. 7B is a cross-sectional view, taken along line 7-7 in FIG. 7A, of the exemplary retainer of FIG. 7A.

FIG. 14A is a perspective view of an exemplary sealing element employed in the electronic component of FIG. 9.

FIG. 14B is a cross-sectional view, taken along line 14-14 in FIG. 14A, of the exemplary sealing element of FIG. 14A.

FIG. 15A is a perspective view of an exemplary retainer employed in the electronic component of FIG. 9.

FIG. 15B is a cross-sectional view, taken along line 15-15 in FIG. 15A, of the exemplary retainer of FIG. 15A.

DETAILED DESCRIPTION

The present disclosure is generally directed to electronic components for lighting systems. The electronic components include a housing, one or more heat-generating components (e.g., one or more drivers, one or more lighting boards, etc.) disposed within the housing, one or more thermally conductive heat sinks disposed adjacent the heat-components and configured to dissipate heat from the heat-generating components, and one or more sealing elements disposed between the housing and the heat sinks, respectively. So arranged, each of the one or more sealing elements seals the heat sink and each of the one or more heat sinks is insulated from the housing. In other words, the heat sinks are not in electrical or chemical contact with the housing. This prevents a galvanic reaction from occurring between the housing and the heat sinks. Because such a reaction is no longer possible, the housing and the heat sink can be made of different metallic materials. More specifically, the heat sinks can be made of a metal (e.g., aluminum) that has a thermal conductivity number that is greater than the thermal conductivity number of the metal from which the housing is made (e.g., stainless steel). Accordingly, the heat sinks can dissipate significant amounts of heat generated by the heat-generating components and built-up in the housing. Beneficially, this also allows for the use of higher-performance heat-generating components, such as light-emitting diodes (LEDs) and/or drivers, which tend to generate greater amounts of heat than conventional lighting components.

Figure 1:
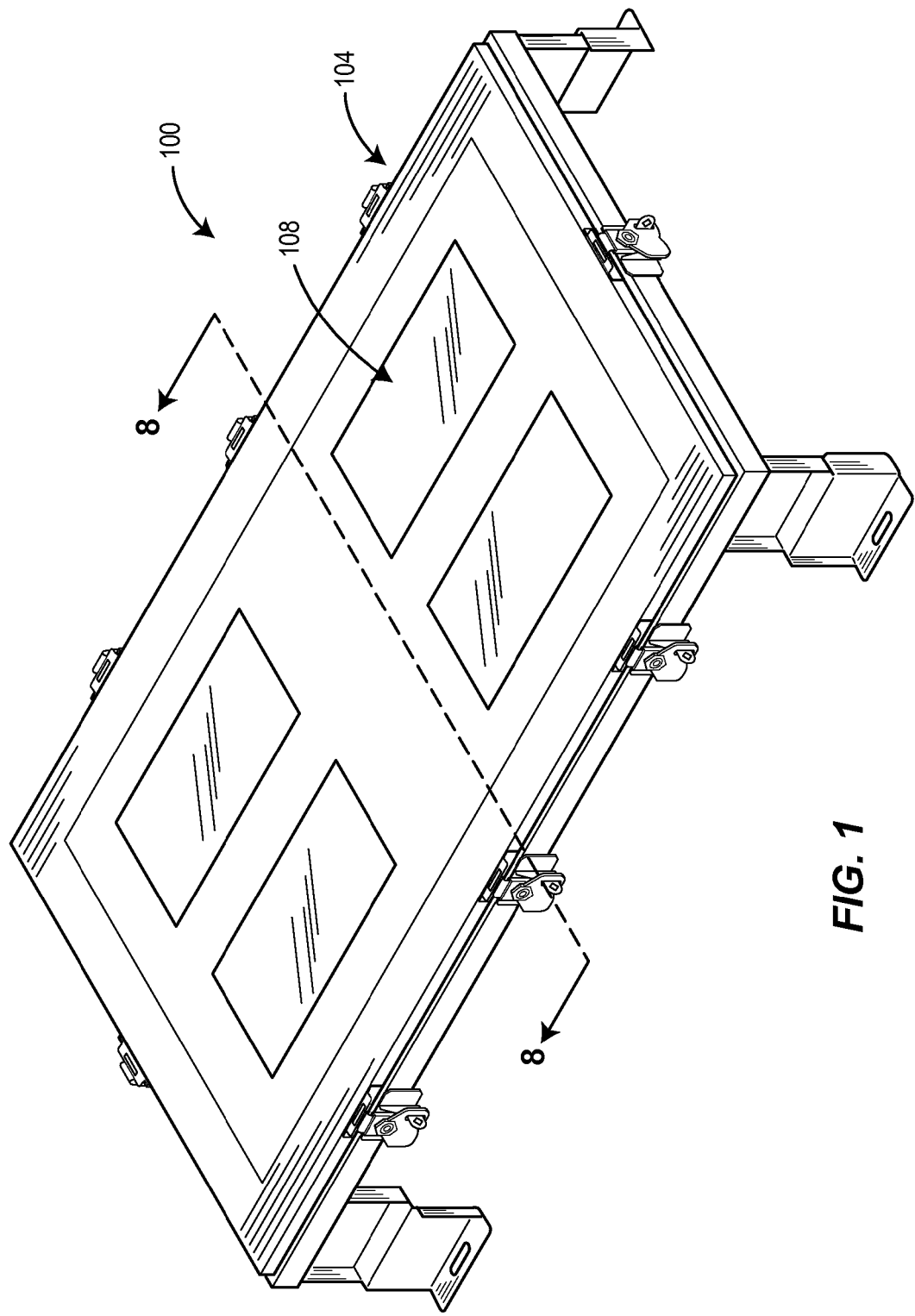
FIG. 1 is a perspective view of one electronic component constructed in accordance with the teachings of the present disclosure.
Figure 2:
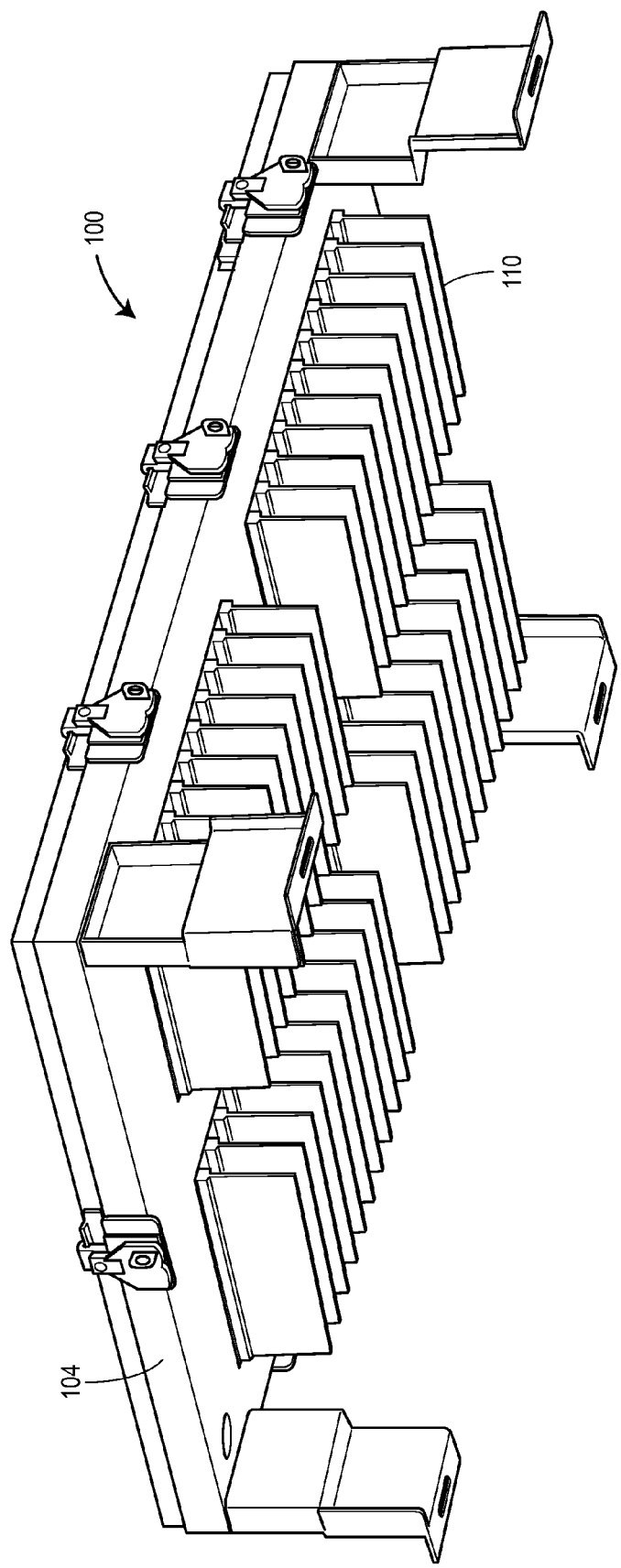
FIG. 2 is a bottom perspective view of the electronic component of FIG. 1.

FIGS. 1 and 2 illustrate one example of an electronic component constructed in accordance with the present disclosure. In this example, the electronic component is a luminaire 100 that includes a housing 104, a plurality of lighting boards 108 disposed (e.g., installed) within the housing 104 (see FIG. 1), and a plurality of heat sinks 110 associated with and configured to dissipate heat generated by the plurality of lighting boards 108 (see FIG. 2), respectively.

The luminaire 100 is associated with a lighting system or a portion thereof, such as, for example, a lighting system included or employed in a parking garage (or a floor or section of the parking garage), commercial building (or a portion thereof), roadway, tunnel, or other structure (or a portion thereof), residential home or building, or other indoor or outdoor space or environment. For example, if the lighting system is installed on one floor of a commercial building, the luminaire 100 can be installed at various locations on the ceiling. As another example, if the lighting system is installed in a tunnel, the luminaire 100 can be installed on the ceiling of the tunnel. In some versions, the lighting system can include a plurality of luminaires 100. For example, a plurality of luminaires 100 can be arranged in an end-to-end series (e.g., on the ceiling of a tunnel) or in a matrix-type configuration, where needed.

Figure 3:
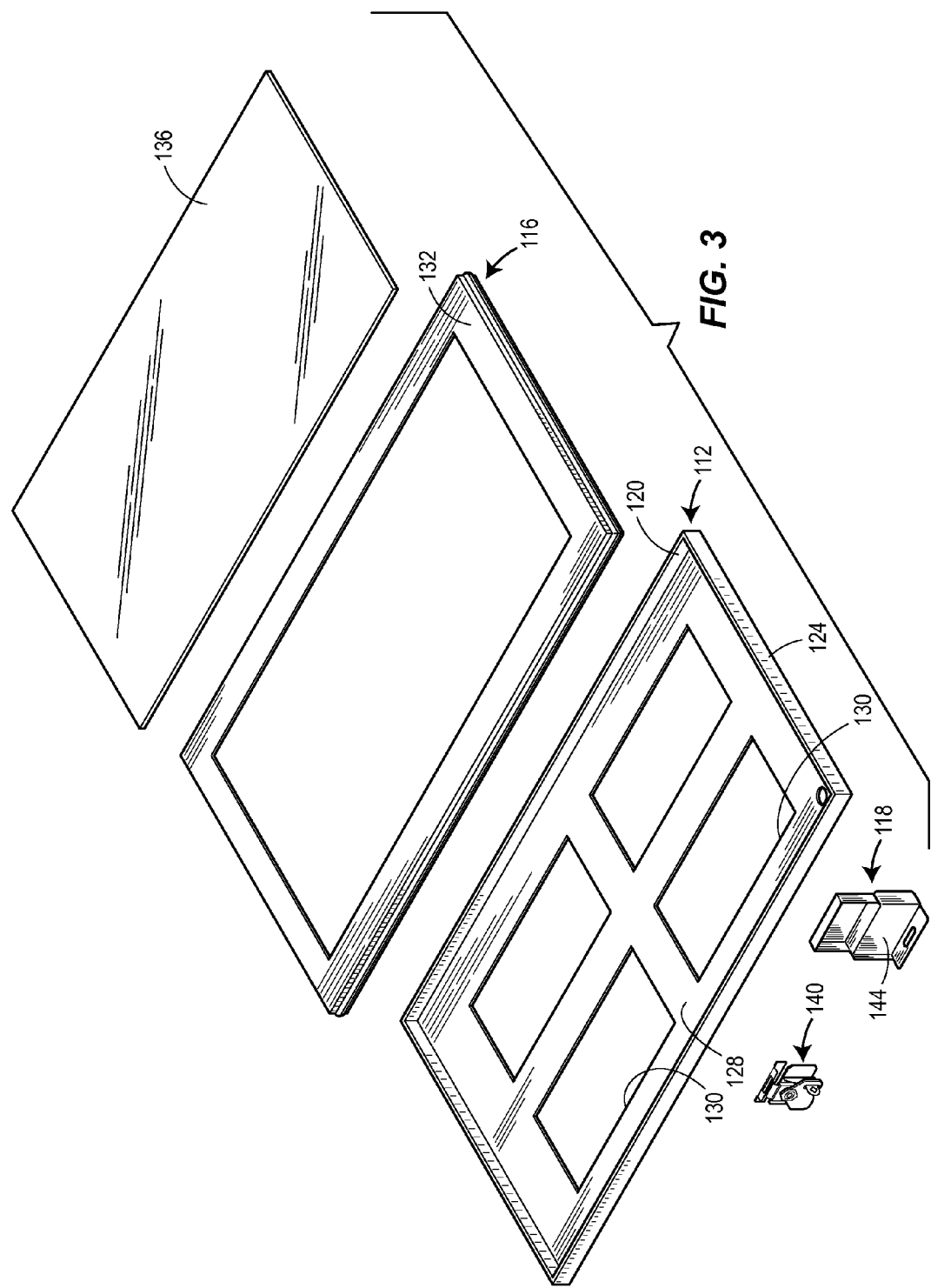
FIG. 3 is a perspective, exploded view of components of a housing of the electronic component of FIG. 1.

FIG. 3 is an exploded view of some of the components of the housing 104. The housing 104 in this example is made entirely of stainless steel (e.g., 316 Stainless Steel, 304 Stainless Steel). As shown in FIG. 3, the housing 104 is defined by a body 112, a door 116 rotatably coupled to the housing body 112, and a base 118 coupled to the housing body 112.

As shown in FIG. 3, the body 112 includes a pair of longitudinally extending opposing sidewalls 120, a pair of transversely extending opposing sidewalls 124, and a bottom wall 128 connected to and disposed between the sidewalls 120, 124. The sidewalls 120, 124 extend upward from the bottom wall 128. The body 112 also includes four rectangularly-shaped openings 130 formed or defined in the bottom wall 128. Each opening 130 is generally sized to receive one of the lighting boards 108, as will be described in greater detail below.

As shown in FIG. 3, the door 116 has a length that is substantially equal to a length of the sidewalls 120 and a width that is substantially equal to a length of the sidewalls 124. The door 116 includes a rectangularly-shaped frame 132 that surrounds a rectangularly-shaped window 136. The window 136 can be made of glass, plastic (e.g., acrylic plastic, polycarbonate plastic), or some other material. The door 116 in this example is rotatably coupled to the body 112 via a plurality of hinges (not visible) coupled to an exterior portion of one of the sidewalls 120. The door 116 can be rotated between a closed position (see FIG. 1), in which the door 116 rests on top portions of the sidewalls 120, 124 and serves to close the housing 104, and an open position (not shown), in which the door 116 is spaced from the top portions of the sidewalls 120, 124 such that the interior contents of the housing 104 are accessible. The door 116 can be secured in the closed position via a plurality of locks or latches 140. The latches 140 are, as shown in FIG. 3, rotary latches, but can, in other versions, be a different type of latch or lock (e.g., a cam lock, a spring latch).

The base 118 is coupled to and extends downwardly from an underside of the housing body 112. The base 118 serves to support the housing 104, but can also be used to mount the luminaire 100, for example to a ceiling. In this example, the base 118 includes four legs 144 that are coupled to and extend downwardly from an underside of the bottom wall 128 of the housing body 112. Only one of the four legs 144 is depicted in FIG. 3, as the legs 144 are structurally identical to one another.

In other versions, the housing 104 can be constructed differently. Specifically, the body 112, the door 116, and/or the base 118 can have a different size, shape, and/or be made of one or more materials other than or in addition to stainless steel. For example, the body 112 can include more or less openings 130, particularly when the luminaire 100 includes more or less lighting boards 108 than the luminaire 100 depicted in FIG. 1. In other versions, the door 116 can take the form of a cover, lid, or any other suitable closure. Moreover, while the door 116 is described as being rotatably connected to the body 112 of the housing 104, the door 116 can, in other versions, be slidably coupled to the body 112 or not connected to the body 112 at all except for the latches 140. As another example, the base 118 can be or include more or less legs, one or more feet, one or more stands, or one or more other support structures.

Figure 4:
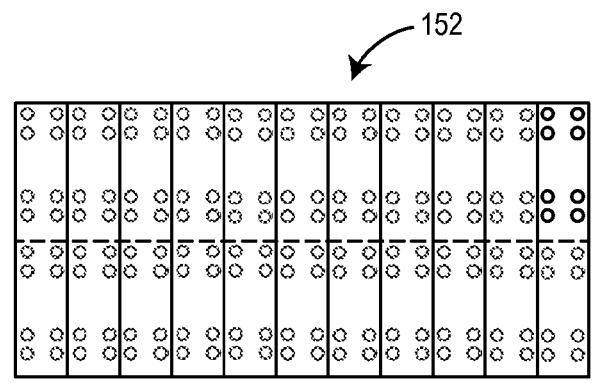
FIG. 4 is a top view of an exemplary lighting board employed in the electronic component of FIG. 1.

FIG. 4 illustrates an example of one of the lighting boards 108 that can be included in the luminaire 100. In this example, the lighting board 108 is a light-emitting diode (LED) board 152. As such, the luminaire 100 depicted in FIG. 1 includes four (4) LED boards 152. Each LED board 152 includes forty-eight (48) LEDs, such that the luminaire 100 has a total of 192 LEDs. In total, the luminaire 100, having four LED boards 152, can emit up to 15,000 lumens of light, which is particularly beneficial when the luminaire 100 is installed in a tunnel or other normally dark location.

In other examples, the luminaire 100 can include more or less LED boards 152. The luminaire 100 can, for example, include one LED board 152, two LED boards 152, three LED boards 152, twelve (12) LED boards 152, twenty-four (24) LED boards 152, or some other number of LED boards 152. Alternatively or additionally, each LED board 152 can include greater or fewer LEDs disposed thereon. For example, each LED board 152 can include four (4) LEDs, six (6) LEDs, twenty-four (24) LEDs, or some other number of LEDs. In other examples, the lighting board(s) 108 can include different types of light-emitting components (e.g., fluorescent, incandescent, or plasma lights), and/or other heat-generating components.

Although not depicted herein, it should be appreciated that the lighting boards 108 (e.g., the LED boards 152) can be powered by one or more drivers. The one or more drivers can, for example, be capable of or configured to output electric power in a range of 300-500 Watts, and can be disposed in a driver box, such as the driver box 300 described in greater detail below or another driver box. The one or more drivers can be secured in the driver box in any number of ways. The driver box can be located remotely from the luminaire 100, and, more particularly, the lighting boards 108 to which it supplies electrical power. For example, the driver box can be located ten feet, twenty feet, thirty feet, or some other distance from the luminaire 100.

Figure 5:
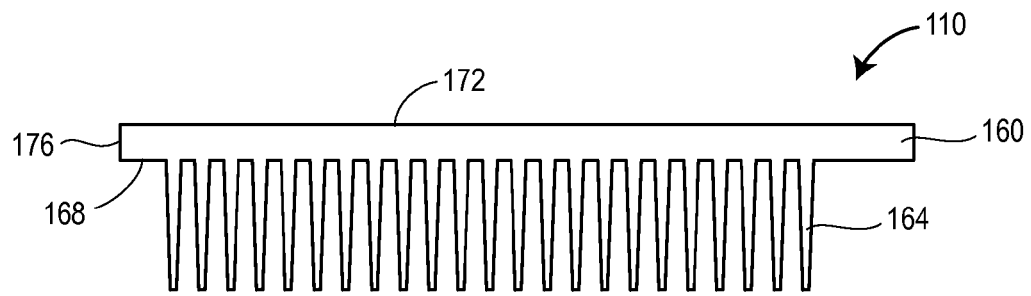
FIG. 5 is an end view of an exemplary heat sink employed in the electronic component of FIG. 1.

FIG. 5 depicts one of the heat sinks 110 that can be included in the luminaire 100. The heat sinks 110 in this example are made of aluminum (e.g., an Aluminum alloy). As shown in FIG. 5, the heat sink 110 includes a top wall 160 and a plurality of fins 164 coupled to and extending downward from the top wall 160. The top wall 160 has a generally rectangular shape and includes an underside or bottom surface 168, an upper surface 172, and a circumferentially extending perimeter edge 176. The fins 164 extend away from the top wall 160 and are parallel to one another. As will be described in greater detail below, the heat sinks 110 can be disposed adjacent (e.g., in proximity to) the lighting boards 108 to facilitate the transfer of heat generated by the lighting boards 108 away from the lighting boards 108 and to the environment surrounding the fins 164.

As shown in FIG. 1, the luminaire 100 of this version includes four (4) heat sinks 110. In other versions, however, the luminaire 100 can include more or less heat sinks 110 than the luminaire 100 illustrated in FIG. 1. For example, when the luminaire 100 only includes two lighting boards 108, the luminaire 100 can include two heat sinks 110. The heat sinks 110 can generally have a different size and/or shape than the heat sinks 110 illustrated herein. For example, the heat sinks 110 can have a circular, oblong, triangular, irregular, or other shape. In some versions, the luminaire 100 can include heat sinks 110 that vary in shape and/or size from one another, such as, for example, when different lighting boards or heat-generating components 108 are included in the luminaire 100. While the heat sinks 110 are described as being made of aluminum, the heat sinks 110 can alternatively or additionally be made of one or more different materials, such as, for example, copper, some sort of composite alloy material (e.g., copper-tungsten), or any other thermally conductive material. The heat sinks 110 can have a different number of fins 164 and/or the fins 164 can be configured or oriented differently. For example, the fins 164 need not be parallel to one another. As another example, the fins 164 can be longer or shorter than the fins 164 illustrated in FIG. 5.

Because the housing 104 and the heat sinks 110 are made of different metallic materials, a plurality of sealing elements 200 can be disposed between the housing 104 and the heat sinks 110 to seal the heat sinks 110 and insulate the heat sinks 110 from the housing 104, and, in turn, prevent direct electrical or chemical contact between the housing 104 and the heat sinks 110. Such an arrangement prevents galvanic reactions from occurring between the housing 104 and the heat sinks 110. As is known in the art, such a reaction may cause the housing 104 and/or the heat sinks 110 to corrode.

FIGS. 6A and 6B depict an example of one of the sealing elements 200 that can be utilized in connection with the luminaire 100. The sealing element 200 depicted in this example is a rectangularly-shaped silicone gasket, but could be made of other sufficiently insulating materials to achieve the intended objective. The sealing element 200 has a generally C-shaped or turned U-shaped cross-section with an inwardly-extending top portion 204, an inwardly-extending bottom portion 208, and a middle portion 210 connecting and extending between the top and bottom portions 204, 208. An inwardly-facing receiving channel 212 is defined by and between the top, bottom, and middle portions 204, 208, 210. As shown in FIG. 6B, the top portion 204 can extend further inward than the bottom portion 208, though this need not be the case. Other shapes and configurations, including simple rectangular cross-sections, for the gasket are also possible.

The luminaire 100 depicted in FIG. 1 includes four (4) sealing elements 200, one for each heat sink 110. In other versions, however, the luminaire 100 can include more or less sealing elements 200. For example, when the luminaire 100 only includes two (2) heat sinks 110, the luminaire 100 can include two (2) sealing elements 200. In other versions, one or more of the sealing elements 200 can vary from the sealing element 200 illustrated in FIGS. 6A and 6B. Specifically, the sealing elements 200 can vary in shape and/or size. For example, the sealing elements 200 can have a circular, oblong, triangular, irregular, or other shape. As another example, the sealing elements 200 can be flat (i.e., the sealing elements 200 need not include receiving channels 212). Moreover, the receiving channel 212 can have a different size and/or shape. Additionally, while the sealing elements 200 are described as being silicone gaskets, the sealing elements 200 can, in other versions, be made of a different type of insulating material, such as, for example, graphite, plastic, other rubbers, wood, paper, cardboard, felt, clay, asphalt, etc.

As will be described in greater detail below, the luminaire 100 includes one or more retainers (e.g., clamp brackets) 250 for securing the sealing elements 200 to a portion of the housing 104. The luminaire 100 depicted in FIG. 1 includes four retainers 250, each retainer 250 being utilized to secure a respective one of the sealing elements 200 to a portion of the housing 104. FIGS. 7A and 7B illustrate an example of a portion of one of the retainers 250, which generally have a similar shape and size as the sealing elements 200. In this example, each retainer 250 is made of the same material as the housing 104 (e.g., Stainless Steel) and has a generally-shelf-like shape, with an inwardly-extending lower portion 254 that steps up to an inwardly-extending upper portion 258. Each retainer 250 also includes a shoulder surface 262 defined by the lower and upper portions 254, 258. The shoulder surface 262 is formed of a longitudinally-extending portion 262a and a laterally-extending portion 262b. Each retainer 250 further includes a plurality of circumferentially-spaced apertures 266 each configured to receive a fastener (e.g., a screw, a rivet, a PEM stud, a nut, etc.) to secure the respective retainer 250 to the housing 104.

In other versions, the luminaire 100 can include more or less retainers 250. The luminaire 100 can, for example, include more or less retainers 250 when the luminaire 100 includes more or less sealing elements 200. In some versions, one or more of the retainers 250 can include one or more discrete or separately formed sections or parts, and each section or part can be considered a separate retainer. In other versions, one or more of the retainers 250 can vary from the retainer 250 illustrated in FIGS. 7A and 7B. Specifically, the retainers 250 can vary in shape and/or size. For example, the retainers 250 can have a circular, oblong, triangular, irregular, or other shape. The lower and upper portions 254, 258 of the retainers 250 can also be arranged differently and yet still perform the intended function of securing the sealing elements 200 to a portion of the housing 104. Additionally, while the retainers 250 are described as being made of the same material as the housing 104, specifically Stainless Steel, the retainers 250 can, in other versions, be made of a different material than the housing 104 and/or one or more different materials and could be made of the same material as the sealing element(s) 200.

Figure 8:
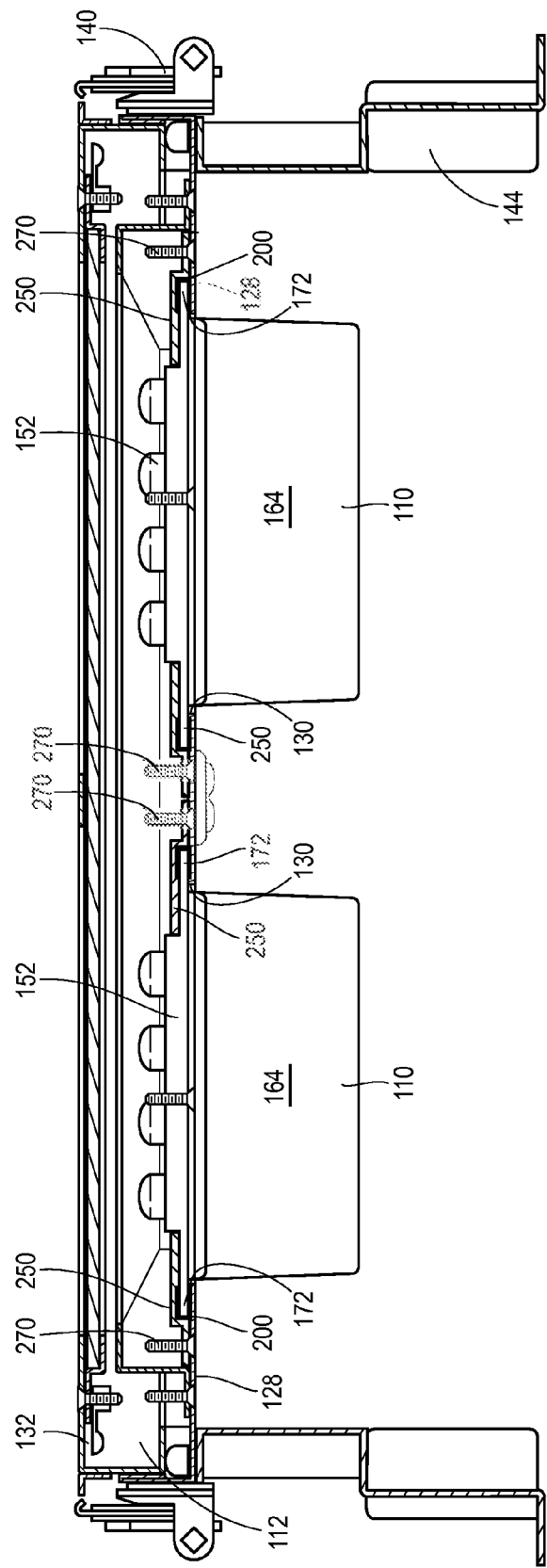
FIG. 8 is a cross-sectional view, taken along line 8-8 in FIG. 1, of the electronic component of FIG. 1.

FIG. 8 is a cross-sectional view of FIG. 1, showing the luminaire 100 as assembled and including the housing 104, the lighting boards 108, the heat sinks 110, the sealing elements 200, and the retainers 250. The heat sinks 110 can be disposed through the openings 130 defined in the bottom wall 128 of the housing 104, such that the top wall 160 of each heat sink 110 is disposed within the housing 104 and the fins 164 of each heat sink 110 extend downward and away from the housing 104. The LED boards 152 can, in turn, be disposed on (e.g., in contact with) or adjacent to the top portion 172 of the heat sinks 110, respectively. To seal and insulate the heat sinks 110 from the housing 104, which can be made of a different material than the heat sinks 110, the sealing elements 200 can be disposed between the housing 104 and the heat sinks 110. To this end, a portion of each heat sink 110 can be disposed within a portion of a respective one of the sealing elements 200. Specifically, the perimeter edge 176 of each heat sink 110 can be disposed (e.g., seated) within the receiving channel 212.

The heat sinks 110 and the sealing elements 200 can be secured in this position using the retainers 250, but other possibilities, such as adhesives, friction, etc. could alternatively be used. As shown in FIG. 8, the lower portion 254 of each retainer 250 is disposed over a portion of the bottom wall 128 of the housing 104 and the upper portion 258 of each retainer 250 is disposed over the inwardly-extending top portion 204 of a respective one of the sealing elements 200, with the longitudinally-extending portion 262a of each retainer 250 immediately adjacent (e.g., in contact with) the middle portion 210 of a respective one of the sealing elements 200, and the laterally-extending portion 262b of each retainer 250 disposed over and in contact with the top portion 204 of a respective one of the sealing elements 200. A plurality of fasteners 270 (e.g., screws, rivets, etc.) can be used to secure each of the retainers 250, so disposed, to the bottom wall 128 of the housing 104.

In other versions, the retainers 250 can be secured to the housing 104 in a different manner. For example, the retainers 250 can be glued, snapped, or otherwise attached to the housing 104. In other versions, the sealing elements 200 can be secured without using the retainers 250. For example, a plurality of fasteners can be inserted into a portion of the sealing elements 200 to secure the sealing elements 200 to the housing 104, as described above.

Accordingly, the heat sinks 110 are disposed adjacent (e.g., in contact with) the LED boards 152, which generate heat within the housing 104. The heat sinks 110 are configured to dissipate this heat by facilitating the transfer of this heat to the surrounding ambient environment. At the same time, the sealing elements 200, by virtue of being disposed between the housing 104 and the heat sinks 110, serve to seal the heat sinks 110 and serve to insulate the heat sinks 110 from the housing 104 and, more particularly, the material of the heat sinks 110 from the material of the housing 104. As the heat sinks 110 in this example are made of a different material than the housing 104, such an arrangement prevents a galvanic reaction between the heat sinks 110 and the housing 104.

Figure 9:
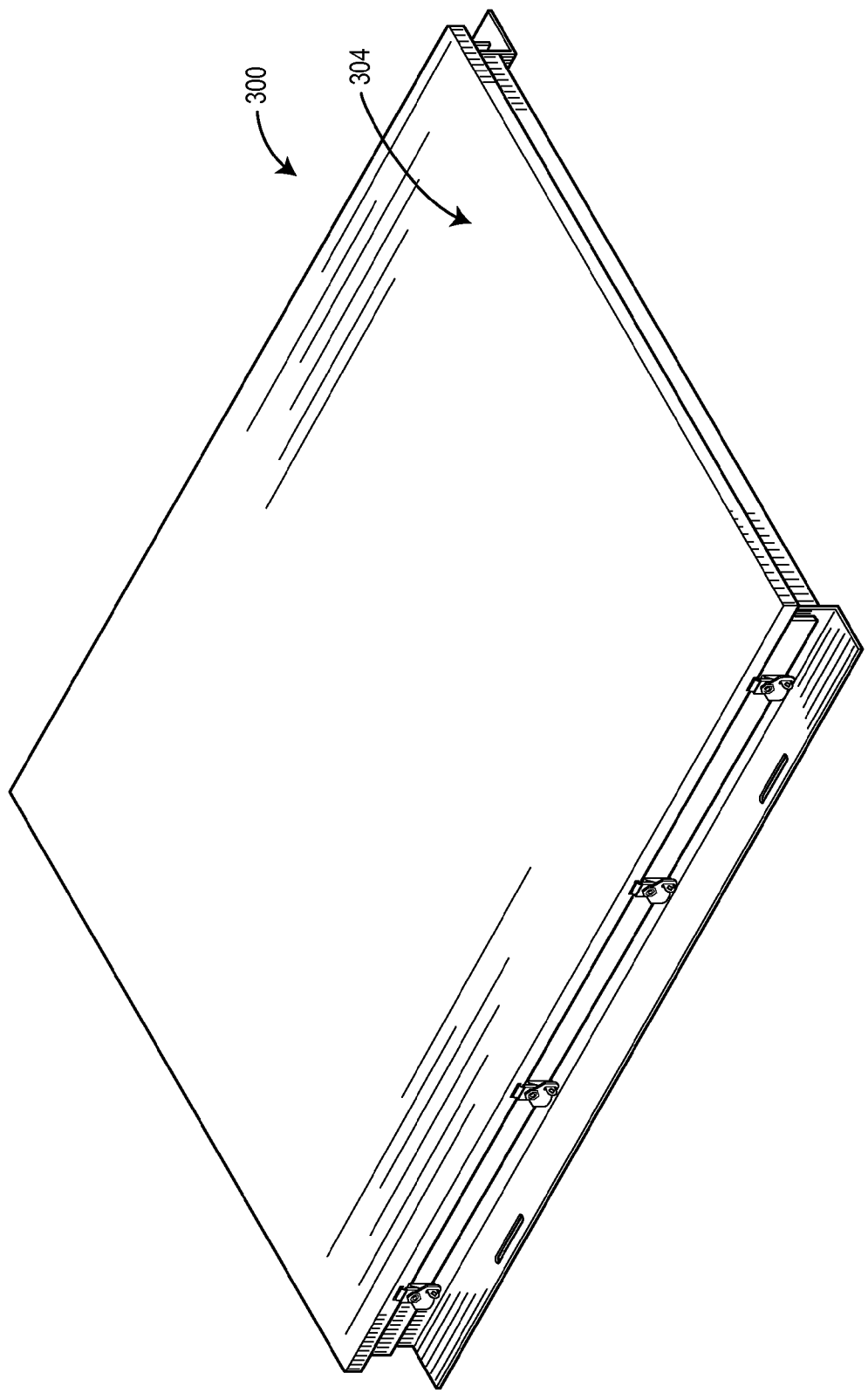
FIG. 9 is a perspective view of another electronic component constructed in accordance with the teachings of the present disclosure, the electronic component having a door occupying a closed position.
Figure 10:
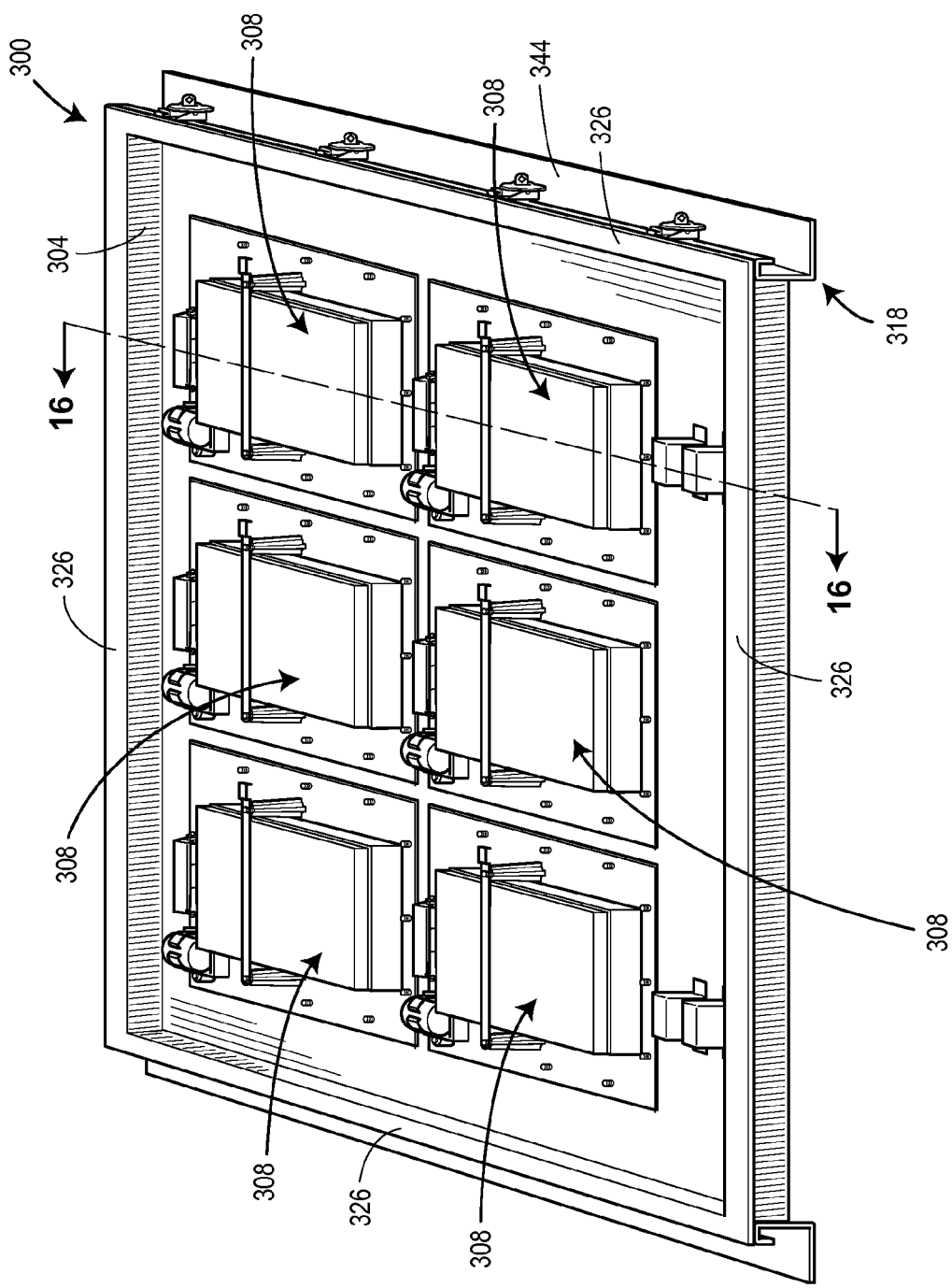
FIG. 10 is a perspective view of the electronic component of FIG. 9, but with the door of the electronic component removed.
Figure 11:
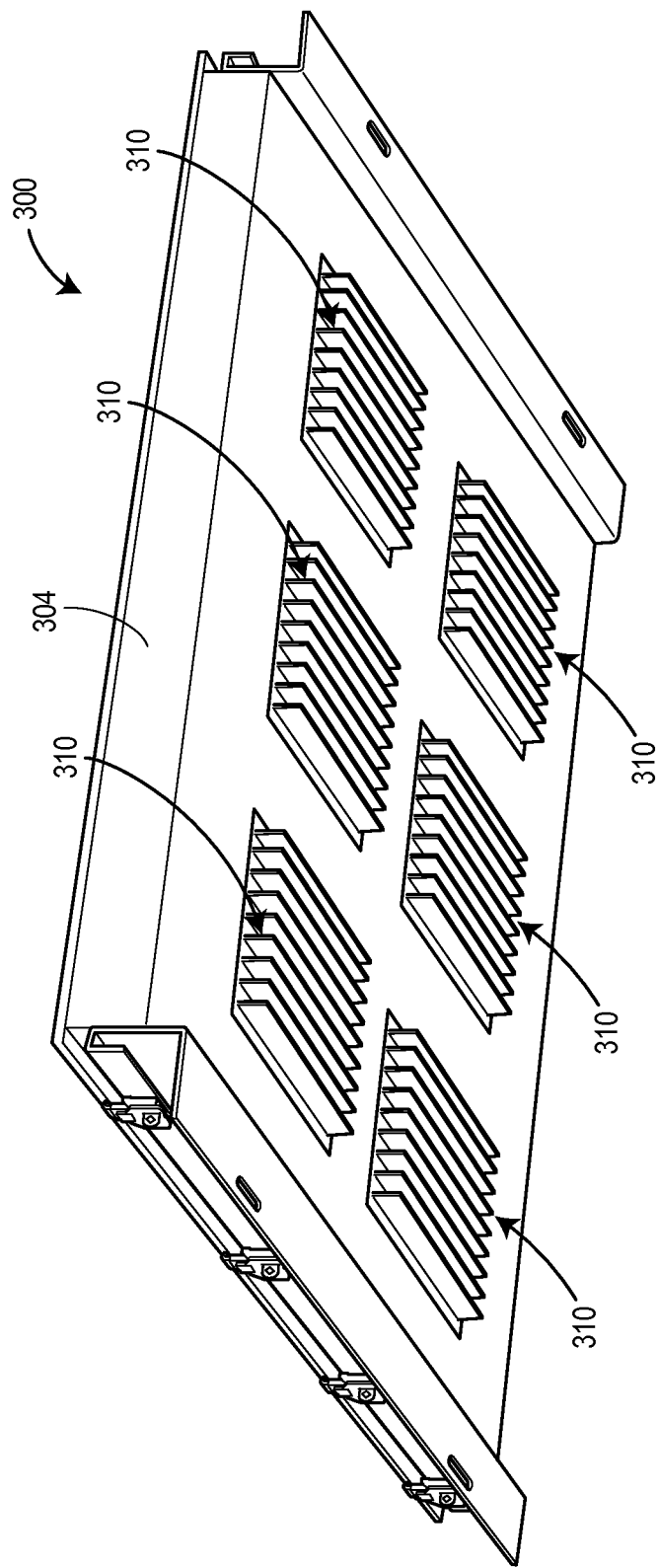
FIG. 11 is a bottom perspective view of the electronic component of FIG. 9.

FIGS. 9-11 illustrate another example of an electronic component constructed in accordance with the present disclosure. In this example, the electronic component is a driver box 300 that includes a driver housing 304, a plurality of drivers 308 disposed (e.g., installed) within the housing 304 (see FIG. 10), and a plurality of heat sinks 310 associated with and configured to dissipate heat generated by a respective one of the plurality of drivers 308.

The driver box 300, through the drivers 308, is configured to supply electric power to one or more luminaires or light fixtures, including, for example, the luminaire 100 described above. The driver box 300 and the one or more luminaires or light fixtures can be associated with a lighting system or a portion thereof, such as, for example, a lighting system included or employed in a parking garage (or a floor or section of the parking garage), commercial building (or a portion thereof), roadway, tunnel, or other structure (or a portion thereof), residential home or building, or other indoor or outdoor space or environment. For example, if the lighting system is installed on one floor of a commercial building, one or more luminaires can be installed at various locations in the ceiling of the floor and the driver box 300 can be located in a separate control room on that same floor or on a different floor. As another example, if the lighting system is installed in a tunnel, one or more luminaires can be installed on the ceiling of the tunnel and the driver box 300 can be located in a separate control room, on one of the sides of the tunnel, near a ground level of the tunnel, or in other locations.

In some versions, the driver box 300 can be located remotely from each of the one or more luminaires to which it (and more specifically its drivers 308) supplies electric power. The driver box 300 can, for example, be located a distance of ten feet, twenty feet, thirty feet, or some other distance from each of the one or more luminaires to which it supplies electric power.

In some versions, the lighting system can include a plurality of driver boxes 300 configured to supply electric power to a plurality of luminaires or lighting fixtures. For example, a lighting system installed in a tunnel and that requires hundreds of luminaires for proper illumination may necessitate multiple driver boxes 300 installed in the tunnel.

Figure 12:
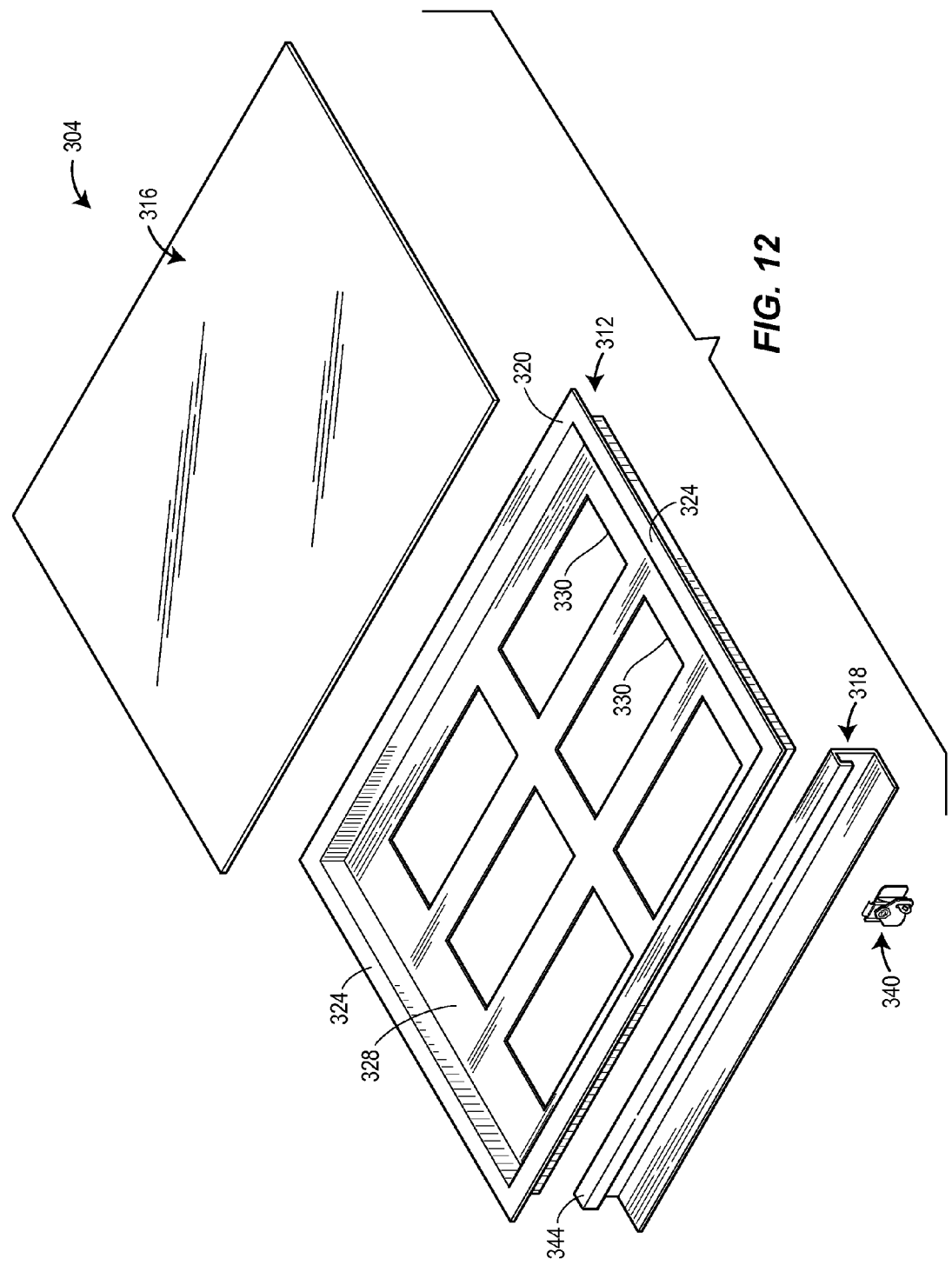
FIG. 12 is a perspective, exploded view of components of a housing of the electronic component of FIG. 9.

FIG. 12 is an exploded view of some of the components of the housing 304. The housing 304 in this example is made entirely of stainless steel (e.g., 316 Stainless Steel, 304 Stainless Steel). As shown in FIG. 12, the housing 304 is defined by a body 312, a door 316 rotatably coupled to the housing body 312, and a base 318 coupled to the housing body 312.

The body 312 includes a pair of longitudinally extending opposing sidewalls 320, a pair of transversely extending opposing sidewalls 324, and a bottom wall 328 connected to and disposed between the sidewalls 320, 324. The sidewalls 320, 324 extend upward from the bottom wall 328. The body 312 also includes a wall portion 326 coupled to and extending laterally outward from a top portion of each of the sidewalls 320, 324. The body 312 also includes six rectangularly-shaped openings 330 formed or defined in the bottom wall 328. Each opening 330 is generally sized to receive one of the drivers 308, as will be described in greater detail below.

The door 316 has a length that is substantially equal to a length of the sidewalls 320 and a width that is substantially equal to a length of the sidewalls 324. Unlike the door 116 described above, the door 316 depicted in FIG. 12 does not include a window, but, in other versions, the door 316 can include a window made of glass, plastic (e.g., acrylic plastic, polycarbonate plastic), or some other material. The door 316 in this example is rotatably coupled to the body 312 via a plurality of hinges (not visible) coupled to an exterior portion of one of the sidewalls 320. The door 316 can be rotated between a closed position (see FIG. 9), in which the door 316 rests on the wall portions 326 and serves to close the housing 304, and an open position (not shown), in which the door 316 is spaced from the top portions of the sidewalls 320, 324 such that the interior contents of the housing 304 are accessible. The door 316 can be secured in the closed position via a plurality of locks or latches 340. The latches 340 are, as shown in FIG. 12, rotary latches, but can, in other versions, be a different type of latch or lock (e.g., a cam lock, a spring latch).

The base 318 is coupled to and extends downwardly from an underside of the housing body 312. The base 318 serves to support the housing 304, but can also be used to mount the luminaire 300, for example to a ceiling. In this example, the base 318 includes two (2) supports 344 that are coupled to and extend downwardly and outwardly from an underside of the wall portions 326 of the housing body 312. Only one support 344 is depicted in FIG. 12, as the supports 344 are structurally identical to one another.

In other versions, the housing 304 can be constructed differently. Specifically, the body 312, the door 316, and/or the base 318 can have a different size, shape, and/or be made of one or more materials other than or in addition to stainless steel. For example, the body 312 can include more or less openings 330, particularly when the driver box 300 includes more or less drivers 308 than the driver box 300 depicted in FIG. 10. In other versions, the door 316 can take the form of a cover, lid, or any other suitable closure. Moreover, while the door 316 is described as being rotatably connected to the body 312 of the housing 304, the door 316 can, in other versions, be slidably coupled to the body 312 or not connected to the body 312 at all except for the latches 340. As another example, the base 318 can be or include more or less supports, one or more legs (e.g., the legs 144 described above), one or more feet, one or more stands, or one or more other support structures.

With reference back to FIG. 11, the driver box 300 in this example includes six (6) drivers 308 arranged in rows and columns within the housing 304. The drivers 308 can be secured in or to the driver box 300 in any number of ways. Each driver 308 includes various components configured to provide electric power to one or more luminaires, as understood in the art. In some versions, each driver 308 can output electric power in a range of 300-500 Watts, which, in some cases, is sufficient to supply adequate electric power to four (4) to eight (8) luminaires. In these versions, the driver box 300, having six (6) drivers 308, can supply electric power to twenty-four (24) luminaires. Although not depicted herein, each driver 308 can include a connector configured to connect the driver 308 to one or more conductors (e.g., one or more wires, one or more cables, or one or more other conductors) for conducting electric power from the driver 308 to the luminaire(s).

It should be appreciated that the driver box 300 can include more or less drivers 308. For example, the driver box 300 can include two (2), four (4), or some other number of drivers 308. It should also be appreciated that the drivers 300 can be arranged differently within the driver box 300.

Figure 13:
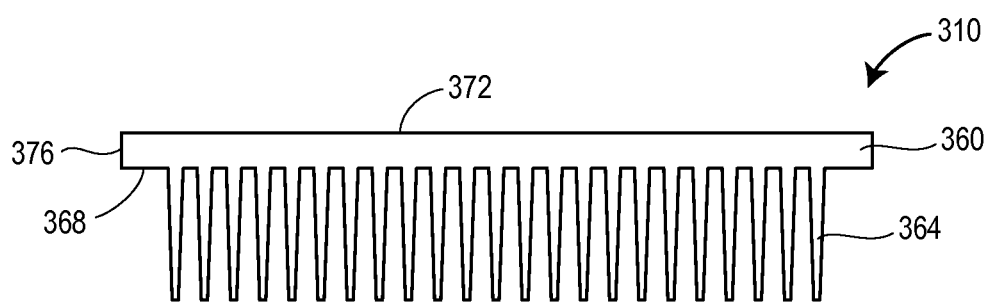
FIG. 13 is an end view of an exemplary heat sink employed in the electronic component of FIG. 9.

FIG. 13 illustrates one of the heat sinks 310 that can be included in the driver box 300. The heat sinks 310 in this example are made of aluminum (e.g., an Aluminum alloy). As shown in FIG. 13, the heat sink 310 includes a top wall 360 and a plurality of fins 364 coupled to and extending downward from the top wall 360. The top wall 360 has a generally rectangular shape and includes an underside or bottom surface 368, an upper surface 372, and a circumferentially extending perimeter edge 376. The fins 364 extend away from the top wall 360 and are parallel to one another. As will be described in greater detail below, the heat sinks 310 can be disposed adjacent (e.g., in proximity to) the drivers 308, respectively, to facilitate the transfer of heat generated by the drivers 308 away from the drivers 308 and to the environment surrounding the fins 364.

As shown in FIG. 11, the driver box 300 includes six (6) heat sinks 310, one for or corresponding to each of the six (6) drivers 308. In other versions, however, the driver box 300 can include more or less heat sinks 310 than the driver box 300 illustrated in FIG. 11. For example, when the driver box 300 only includes two drivers 308, the driver box 300 can include two heat sinks 310. The heat sinks 310 can generally have a different size and/or shape than the heat sinks 310 illustrated herein. For example, the heat sinks 310 can have a circular, oblong, triangular, irregular, or other shape. In some versions, the driver box 300 can include heat sinks 310 that vary in shape and/or size from one another, such as, for example, when different drivers 308 are included in the luminaire 100. While the heat sinks 310 are described as being made of aluminum, the heat sinks 310 can alternatively or additionally be made of one or more different materials, such as, for example, copper, some sort of composite alloy material (e.g., copper-tungsten), or some other thermally conductive metallic material. The heat sinks 310 can have a different number of fins 364 and/or the fins 364 can be configured or oriented differently. For example, the fins 364 need not be parallel to one another. As another example, the fins 364 can be longer or shorter than the fins 364 illustrated in FIG. 5.

Because the housing 304 and the heat sinks 310 are made of different metallic materials, a plurality of sealing elements 400 can be disposed between the housing 304 and the heat sinks 310 to seal the heat sinks 310 and to insulate the heat sinks 310 from the housing 304 (i.e., prevent direct electrical or chemical contact between the housing 304 and the heat sinks 310). Such an arrangement prevents galvanic reactions from occurring between the housing 304 and the heat sinks 310. As is known in the art, such a reaction may cause the housing 304 and/or the heat sinks 310 to corrode.

FIGS. 14A and 14B depict an example of one of the sealing elements 400 that can be utilized in connection with the driver box 300. The sealing element 400 depicted in this example is a rectangularly-shaped silicone gasket, but could be made of other sufficiently insulating materials to achieve the intended objective. The sealing element 400 has a generally C-shaped or turned U-shaped cross-section with an inwardly-extending top portion 404, an inwardly-extending bottom portion 408, and a middle portion 410 connecting and extending between the top and bottom portions 404, 408. An inwardly-facing receiving channel 412 defined by and between the top, bottom, and middle portions 404, 408, 410. Other shapes and configurations, including simple rectangular cross-sections, for the gasket are also possible.

The driver box 300 includes six (6) sealing elements 400, one for or corresponding to each heat sink 310. In other versions, however, the driver box 300 can include more or less sealing elements 400. For example, when the driver box 300 only includes two (2) heat sinks 310, the driver box 300 can include two (2) sealing elements 400. In other versions, one or more of the sealing elements 400 can vary from the sealing element 400 illustrated in FIGS. 14A and 14B. Specifically, the sealing elements 400 can vary in shape and/or size. For example, the sealing elements 400 can have a circular, oblong, triangular, irregular, or other shape. As another example, the sealing elements 400 can be flat (i.e., the sealing elements 400 need not include receiving channels 412). Moreover, the receiving channel 412 can have a different size and/or shape. Additionally, while the sealing elements 400 are described as being silicone gaskets, the sealing elements 400 can, in other versions, be made of a different type of insulating material, such as, for example, graphite, plastic, other rubbers, wood, paper, cardboard, felt, clay, asphalt, etc.

As will be described in greater detail below, the driver box 300 includes one or more retainers (e.g., clamp brackets) 450 for securing the sealing elements 400 to a portion of the housing 304. The driver box 300 in this example includes six retainers 450, each retainer 450 being utilized to secure a respective one of the sealing elements 400 to a portion of the housing 304. FIGS. 15A and 15B illustrate an example of one of the retainers 450. In this example, the retainer 450 is made of the same material as the housing 304 (i.e., Stainless Steel) and has an L shape, with an outwardly extending portion 454 and an upper portion 458 that is coupled to and extends vertically upward from the portion 454. The retainer 450 further includes a plurality of circumferentially-spaced apertures 466 each configured to receive a fastener (e.g., a screw, a rivet, a PEM stud, a nut, etc.) to secure the retainer 450 to the housing 304.

In other versions, the driver box 300 can include more or less retainers 450. The driver box 300 can, for example, include more or less retainers 450 when the driver box 300 includes more or less sealing elements 400. In some versions, one or more of the retainers 450 can include one or more discrete or separately formed sections or parts, and each section or part can be considered a separate retainer. In other versions, one or more of the retainers 450 can vary from the retainer 450 illustrated in FIGS. 15A and 15B. Specifically, the retainers 450 can vary in shape and/or size. For example, the retainers 450 can have a circular, oblong, triangular, irregular, or other shape. The lower and upper portions 454, 458 of the retainers 250 can also be constructed or arranged differently and yet still perform the intended function of securing the sealing elements 400 to a portion of the housing 304. Additionally, while the retainers 450 are described as being made of the same material as the housing 304, specifically Stainless Steel, the retainers 450 can, in other versions, be made of a different material than the housing 304 and/or one or more different materials and could be made of the same material as the sealing element(s) 400.

Figure 16:
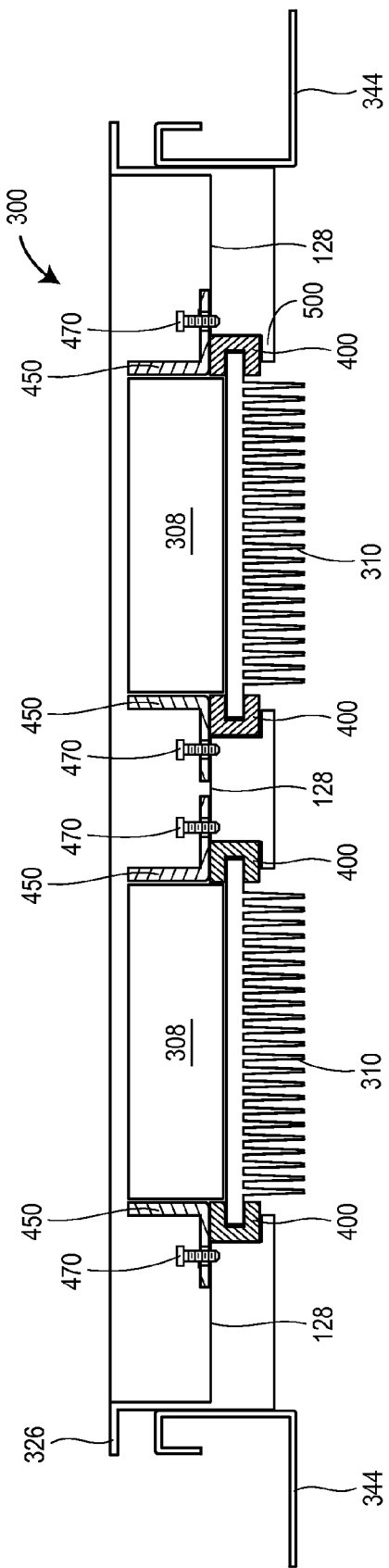
FIG. 16 is a cross-sectional view, taken along line 16-16 in FIG. 10, of the electronic component of FIG. 9.

FIG. 16 is a cross-sectional view taken from FIG. 10, showing the driver box 300 as assembled and including the housing 304, the drivers 308, the heat sinks 310, the sealing elements 400, and the retainers 450. The heat sinks 310 can be disposed through the openings 330, respectively, defined in the bottom wall 328 of the housing 304, such that the top wall 360 of each heat sink 310 is disposed within the housing 304 and the fins 364 of each heat sink 310 extend downward and away from the housing 304. The drivers 308 can, in, turn, be disposed on (e.g., in contact with) or adjacent to the top portion 372 of the heat sinks 310, respectively. To seal off the heat sinks 310, and to insulate the heat sinks 310 from the housing 304, which can be made of a different material than the heat sinks 310, the sealing elements 400 can be disposed between the housing 304 and the heat sinks 310. To this end, each sealing element 400 can be disposed in a respective one of the openings 330 and a portion of each sink 310 can be disposed within a portion of a respective one of the sealing elements 400. Specifically, a bottom surface of the bottom portion 408 of each sealing element 400 can be seated on a respective one of the ledges 500, which help to define the openings 330, respectively, and the perimeter edge 376 of each heat sink 310 can be disposed (e.g., seated) within the receiving channel 412 of a respective one of the sealing elements 400.

The heat sinks 310 and the sealing elements 400 can be secured in this position using the retainers 450, but other possibilities, such as adhesives, friction, etc., could alternatively be used. As shown in FIG. 16, the portion 454 of each retainer 450 is disposed over a portion of the bottom wall 328 of the housing 304 and over the top portion 404 of a respective one of the sealing elements 400, with the portion 458 of each retainer 450 immediately adjacent (e.g., in contact with) a respective one of the drivers 308. A plurality of fasteners 470 can be used to secure each of the retainers 450, so disposed, to the bottom wall 328 of the housing 304.

In other versions, the retainers 450 can be secured to the housing 304 in a different manner. For example, the retainers 450 can be glued, snapped, or otherwise attached to the housing 304. In other versions, the sealing elements 400 can be secured without using the retainers 450. For example, a plurality of fasteners can be inserted into a portion of the sealing elements 400 to secure the sealing elements 400 to the housing 304, as described above.

Accordingly, the heat sinks 310 are disposed adjacent (e.g., in contact with) the drivers 308, which generate heat within the housing 304. The heat sinks 310 are configured to dissipate this heat by facilitating the transfer of this heat to the surrounding environment. At the same time, the sealing elements 400, by virtue of being disposed between the housing 304 and the heat sinks 310, serve to seal off the heat sinks 310 and to insulate the heat sinks 310 from the housing 304 and, more particularly, the material of the heat sinks 310 from the material of the housing 304. As the heat sinks 310 in this example are made of a different material than the housing 304, such an arrangement prevents a galvanic reaction between the heat sinks 310 and the housing 304.

Based on the foregoing description, it should be appreciated that the electronic components described herein include a housing, one or more heat-generating components, one or more heat sinks, and one or more sealing elements that can be disposed between the housing and the one or more heat sinks to seal off the one or more heat sinks and insulate the heat sinks from the housing. The one or more heat sinks and the housing can be made of different metallic materials. By having heat sinks made of a different material than the housing as described herein, the heat sinks can dissipate significant amounts of heat. Beneficially, this allows higher-performance heat-generating components to be used. At the same time, the sealing elements, by being disposed between the housing and the heat sinks, can prevent a galvanic reaction from occurring between the heat sinks and the housing.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still cooperate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as examples and does not describe every possible embodiment, as describing every possible embodiment would be impractical, if not impossible. One could implement numerous alternate embodiments, using either current technology or technology developed after the filing date of this application.

The invention claimed is:

1. An electronic component, comprising:
   a housing made of a first metallic material;
   a heat-generating component disposed in the housing;
   a heat sink disposed adjacent the heat-generating component and configured to dissipate heat from the heat-generating component, the heat sink being made of a second metallic material different from the first metallic material; and
   a sealing element disposed between the housing and the heat sink, the sealing element insulating the second metallic material from the first metallic material.

2. The electronic component of claim 1, wherein the first metallic material comprises stainless steel, and wherein the second metallic material comprises aluminum.

3. The electronic component of claim 1, wherein the sealing element comprises a gasket.

4. The electronic component of claim 1, further comprising a retainer coupled to the housing, the retainer configured to secure the sealing element against a portion of the housing and a portion of the heat sink.

5. The electronic component of claim 1, wherein the electronic component is a driver box and the heat-generating component comprises a driver.

6. The electronic component of claim 5, wherein the driver is configured to electrically power at least two luminaires located remotely from the electronic component.

7. The electronic component of claim 5, wherein the driver is capable of outputting electric power in a range of 300-500 Watts.

8. The electronic component of claim 1, wherein the heat-generating component comprises a plurality of heat-generating components, each heat-generating component being a driver configured to electrically power at least two luminaires located remotely from the electronic component.

9. The electronic component of claim 8, wherein the heat sink comprises a plurality of heat sinks configured to dissipate heat from the plurality of heat-generating components, respectively, and wherein the sealing element comprises a plurality of sealing elements disposed between the housing and the plurality of heat sinks, respectively, such that the plurality of heat sinks are insulated from the housing.

10. The electronic component of claim 1, wherein the heat-generating component comprises a light-emitting diode (LED) board.

11. The electronic component of claim 1, wherein the heat-generating component comprises a plurality of heat-generating components, each heat-generating component being a light-emitting diode (LED) board.

12. The electronic component of claim 11, wherein each LED board is capable of including 48 LEDs.

13. The electronic component of claim 11, wherein the heat sink comprises a plurality of heat sinks configured to dissipate heat from the plurality of heat-generating components, respectively, and wherein the sealing element further comprises a plurality of sealing elements disposed between the housing and the plurality of heat sinks, respectively, such that the plurality of heat sinks are insulated from the housing.

14. The electronic component of claim 1, further comprising a plurality of feet extending away from the housing.

15. An electronic component, comprising:
   a housing having a first pair of opposing sidewalls, a second pair of opposing sidewalls, a bottom wall, and a cavity defined by the bottom wall;
   a heat-generating component disposed within the cavity;
   a heat sink disposed adjacent the heat-generating component and configured to dissipate heat from the heat-generating component; and
   a sealing element disposed within the cavity between the housing and the heat sink, the sealing element insulating the heat sink from the housing.

16. The electronic component of claim 15, wherein the housing is made of a first metallic material and the heat sink is made of a second metallic material.

17. The electronic component of claim 16, wherein the first metallic material comprises stainless steel, and wherein the second metallic material comprises aluminum.

18. The electronic component of claim 15, wherein the heat-generating component comprises a driver.

19. The electronic component of claim 15, wherein the electronic component is a luminaire and the heat-generating component comprises a lighting board.

20. The electronic component of claim 15, further comprising a retainer coupled to the housing, the retainer configured to secure the sealing element against a portion of the housing and a portion of the heat sink.

21. An electronic component, comprising:
   a housing;
   a heat-generating component disposed within the housing;
   a sealing element coupled to a portion of the housing, the sealing element defining a receiving channel; and
   a heat sink having a portion disposed in the receiving channel of the sealing element, the heat sink configured to dissipate heat from the heat-generating component, wherein the sealing element insulates the heat sink from the housing.

22. The electronic component of claim 21, wherein the housing is made of a first metallic material and the heat sink is made of a second metallic material, the first metallic material being stainless steel, and the second metallic material being aluminum.

23. The electronic component of claim 21, wherein the heat-generating component comprises a driver.

24. The electronic component of claim 21, wherein the heat-generating component comprises a lighting board.

25. The electronic component of claim 21, wherein the heat sink has a perimeter edge, the perimeter edge being disposed in the receiving channel of the sealing element.

26. The electronic component of claim 21, further comprising a retainer coupled to the housing via a plurality of fasteners, the retainer securing the sealing element against a portion of the housing and a portion of the heat sink.

* * * * *